United States Patent
Hirano et al.

(10) Patent No.: US 6,219,236 B1
(45) Date of Patent: *Apr. 17, 2001

(54) COOLING SYSTEM FOR MULTICHIP MODULE

(75) Inventors: Minoru Hirano; Masumi Suzuki, both of Kawasaki (JP)

(73) Assignee: Fujitsu, Ltd., Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/448,496

(22) Filed: Nov. 24, 1999

Related U.S. Application Data

(62) Division of application No. 09/044,313, filed on Mar. 19, 1998.

(30) Foreign Application Priority Data

Oct. 20, 1997 (JP) ..................................... 9-287256

(51) Int. Cl.$^7$ ...................................... H05K 7/20
(52) U.S. Cl. ............................. 361/695; 361/719
(58) Field of Search ................... 165/80.3, 185, 165/908; 454/184; 361/690–695, 697, 702–705, 717–719

(56) References Cited

U.S. PATENT DOCUMENTS

| | | | |
|---|---|---|---|
| 4,151,547 | 4/1979 | Rhoades et al. | 174/16.3 |
| 4,277,816 * | 7/1981 | Dunn . | |
| 4,654,754 | 3/1987 | Daszkowski | 174/16.3 |
| 4,748,495 * | 5/1988 | Kucharek . | |
| 5,296,739 | 3/1994 | Heilbronner et al. | 361/704 |
| 5,325,265 | 6/1994 | Turlik et al. | 361/712 |
| 5,373,418 | 12/1994 | Hayasi | 361/707 |
| 5,502,618 * | 3/1996 | Chiou . | |
| 5,535,094 * | 7/1996 | Nelson . | |
| 5,898,569 * | 4/1999 | Bhatia . | |
| 5,910,694 * | 6/1999 | Yokozawa . | |
| 5,940,267 * | 8/1999 | Katsui . | |
| 5,943,209 * | 8/1999 | Liu . | |

FOREIGN PATENT DOCUMENTS

| | | |
|---|---|---|
| 2-83958 | 3/1990 | (JP) . |
| 3-94455 | 4/1991 | (JP) . |
| 3-229445 | 10/1991 | (JP) . |
| 5-243439 | 9/1993 | (JP) . |
| 6-112676 | 9/1994 | (JP) . |
| 6-260573 | 9/1994 | (JP) . |
| 7-30026 | 1/1995 | (JP) . |
| 7-161886 | 6/1995 | (JP) . |
| 8-139475 | 5/1996 | (JP) . |
| 8-264689 | 10/1996 | (JP) . |

\* cited by examiner

*Primary Examiner*—Gerald Tolin
(74) *Attorney, Agent, or Firm*—Armstrong, Westerman, Hattori, McLeland & Naughton, LLP

(57) ABSTRACT

It is an object of the present invention to provide a cooling system capable of simultaneously cooling the electronic parts on a multichip module that is arranged so as to provide a predetermined function, wherein the cooling system can be easily and quickly attached to and detached from the module when necessary. The present invention is to provide a cooling system for cooling a multichip module MCM having a predetermined function, on the substrate B of which a plurality of electronic parts including heat generating parts P are mounted, the cooling system for cooling a multichip module comprising: a radiating body 1 capable of covering upper portions of the plurality of electronic parts P while a predetermined clearance is formed between the radiating body 1 and the electronic parts P; a sheet S made of silicon rubber arranged in the clearance, for thermally connecting the upper surfaces of the electronic parts and the radiating member; and a screw N for detachably connecting the radiating body with the substrate B of the multichip module MCM.

3 Claims, 6 Drawing Sheets

COOLING SYSTEM FOR MULTICHIP MODULE

This application is a division of prior application Ser. No. 09/044,313 filed Mar. 19, 1998.

BACKGROUND OF THE INVENTION

1. Field of the Invention

The present invention relates to a cooling system for cooling a multichip module having a predetermined function, on the substrate of which a plurality of electronic parts, including heat generating parts, are mounted.

2. Description of the Related Art

Conventionally, the following structure is frequently used. In order to cool a single electronic part, a small heat sink exclusively used for cooling the single electronic part is fixed onto an upper surface of the electronic part. Several examples of the above structure will be briefly described below.

Japanese Unexamined Patent Publication No. 3-94455 discloses a radiating structure for cooling a single semiconductor chip mounted on a substrate. In the structure, a radiating plate exclusively used for cooling the single semiconductor chip is made to come into surface-contact with an upper surface of the semiconductor chip, and a tongue-shaped portion of the radiating plate is fixed to the substrate with bolts.

Japanese Unexamined Patent Publication No. 8-139475 discloses a radiating structure for cooling a single electronic part mounted on a substrate. In the structure, a heat sink exclusively used for cooling the single electronic part is made to come into surface-contact with an upper surface of the electronic part, and the heat sink is pressed against the substrate with two C-shaped metal fittings.

Japanese Unexamined Patent Publication No. 5-243439 discloses a radiating structure for cooling a single electronic part mounted on a substrate. In the structure, a heat sink exclusively used for cooling the single electronic part is made to come into surface-contact with an upper surface of the electronic part, and the radiating plate and the substrate are fixed to each other with four bolts.

Japanese Unexamined Patent Publication No. 6-112676 discloses a radiating structure for cooling a single semiconductor element mounted on a substrate. In the structure, a heat sink exclusively used for cooling the single semiconductor element is made to come into surface-contact with an upper surface of the semiconductor element, and the heat sink and the substrate are fixed to each other with two or four screws.

Japanese Unexamined Patent Publication No. 6-260573 discloses a radiating structure for cooling a single semiconductor package mounted on a substrate. In the structure, a heat sink exclusively used for cooling the single semiconductor package is made to come into surface-contact with an upper surface of the semiconductor package, and the heat sink is fixed to the semiconductor package or the substrate with four screws.

Japanese Unexamined Patent Publication No. 7-161886 discloses a radiating structure for cooling a single semiconductor package mounted on a substrate. In the structure, a heat sink exclusively used for cooling the single semiconductor package is made to come into surface-contact with an upper surface of the semiconductor package, and the heat sink is fixed to the semiconductor package or the substrate with four screws.

Japanese Unexamined Patent Publication No. 8-264689 discloses a radiating structure for cooling a single semiconductor element mounted on a substrate. In the structure, a heat sink exclusively used for cooling the single semiconductor element is made to come into surface-contact with an upper surface of the semiconductor element, and the heat sink is pressed against the substrate with an attaching frame.

Japanese Unexamined Patent Publication No. 3-229445 discloses a radiating structure for cooling a single electronic part mounted on a substrate. In the structure, a support plate is fixed onto an upper surface of the single electronic part with adhesive, and an exclusive heat sink is fixed onto the support plate with screws while a radiating sheet is interposed between the heat sink and the support plate.

Japanese Unexamined Patent Publication No. 2-183958 discloses a cooling structure for cooling a single module incorporated into a chip mounted on a substrate. In the structure, a fan exclusively used for cooling the single module is arranged on the upper side of the module and, in order to cool a plurality of chips mounted on the substrate, a fan is arranged on the upper side of these chips.

Japanese Unexamined Patent Publication No. 7-30026 discloses a cooling structure for cooling a single pin-grid-array. In the structure, a heat sink having fins is fixed onto an upper surface of the pin-grid-array with adhesive.

Although it is possible to individually cool electronic parts in the above conventional cooling structures, it is impossible to simultaneously cool the electronic parts of the module, on which a plurality of electronic parts are mounted, so that a predetermined function can be provided.

SUMMARY OF THE INVENTION

It is an object of the present invention to provide a cooling system capable of simultaneously cooling the electronic parts on a multichip module that is arranged so as to provide a predetermined function, wherein the cooling system can be easily and quickly attached to and detached from the module when necessary.

In order to solve the above problems, the present invention is to provide a cooling system for cooling a multichip module having a predetermined function, on the substrate of which a plurality of electronic parts including heat generating parts are mounted, the cooling system for cooling a multichip module comprising: a radiating body capable of covering the upper portions of the plurality of electronic parts while a predetermined clearance is formed between the radiating body and the electronic parts; a heat conducting member arranged in the clearance, for thermally connecting the upper surfaces of the electronic parts and the radiating member; and a fastening body for detachably connecting the radiating body with the substrate of the multichip module. Due to the above arrangement, the multichip module and the radiating body can be detachably fixed to each other, which is very advantageous in view of practical use. Heat generated by the high heat generating parts of the multichip module is effectively conducted to the radiating body, so that the multichip module can be effectively cooled. As a result, the reliability of the multichip module can be enhanced.

It is preferable that the fastening body includes at least one screw, and the screw is screwed to a corresponding stud perpendicularly arranged on the substrate. It is also preferable that the fastening body includes an elastic frame having a hook portion capable of catching the substrate so that the radiating body can be detachably fixed to the substrate while the fastening body covers the radiating body. It is also preferable that the fastening body includes at least one C-shaped clip to pinch the radiating body and the substrate. It is also preferable that the substrate of the multichip module is flexible. It is also preferable that the radiating body includes a plurality of fins. It is also preferable that a centrifugal fan is attached on an upper surface of the radiating body. It is also preferable that the heat conducting member is made of compound. It is also preferable that the heat conducting member is composed of a flexible sheet.

Another invention is to provide a cooling system for cooling a multichip module having a predetermined function, on the substrate of which a plurality of electronic parts including heat generating parts are mounted, the cooling system for cooling a multichip module comprising: a radiating body capable of covering upper portions of the plurality of electronic parts while a predetermined clearance is formed between the radiating body and the electronic parts; a fastening body for detachably connecting the radiating body with the substrate of the multichip module; and an axial fan attached onto an upper surface of the radiating body, wherein the radiating body includes inlet ports to pass air discharged from the axial fan into the radiating body and also includes discharge ports to discharge air outside. Due to the above arrangement, it becomes possible to detachably fix the multichip module to the radiating body. Therefore, this arrangement can be advantageously put into practical use. Also, heat generated by the high heat generating parts incorporated into the multichip module is effectively discharged outside by a flow of air sent from the axial fan. Accordingly, it is possible to cool the multichip module effectively. As a result, the reliability of the multichip module can be enhanced.

It is preferable that the inlet ports of the radiating body are intensively arranged in a portion of the radiating body corresponding to a region on the substrate in which a large quantity of heat is generated. It is preferable that a nozzle from which air is strongly blown out to a region on the substrate in which a large quantity of heat is generated is attached to at least one inlet port of the radiating body.

BRIEF DESCRIPTION OF THE DRAWINGS

These and other objects of the present invention will become apparent from the following detailed description of the preferred embodiment of the invention, taken in connection with the accompanying drawings.

In the drawings.

DESCRIPTION OF THE PREFERRED EMBODIMENTS

Figure 1:
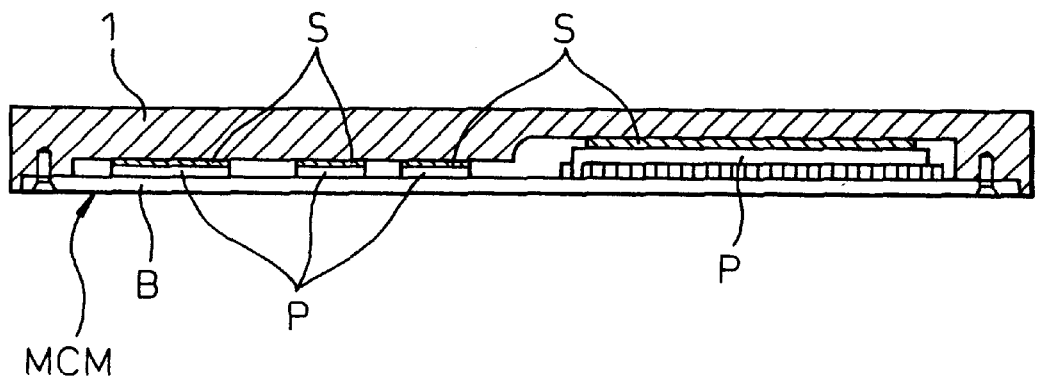
FIG. 1 is a cross-sectional side view of the first embodiment of the cooling system of the multichip module of the present invention.

Referring to the accompanying drawings, a plurality of embodiments of the present invention will be explained below. In this connection, like reference characters are used to indicate like parts and portions in the embodiments, and the duplicate explanations are appropriately omitted here.

Figure 2:
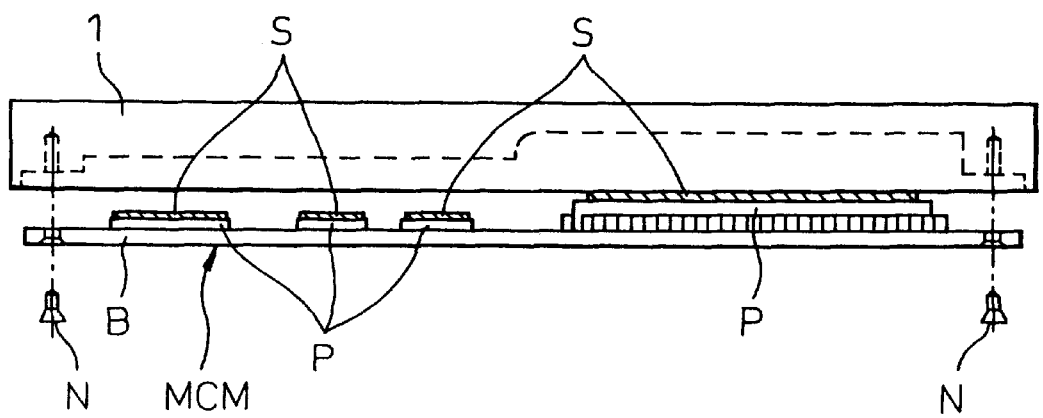
FIG. 2 is an exploded side view of the cooling system shown in FIG. 1.

FIGS. 1 and 2 show the first embodiment of the cooling system of the multichip module, which will be referred to as an MCM hereinafter, of the present invention. The MCM shown in the drawings is composed of a small, for example, rectangular, substrate B on which a plurality of electronic parts P including heat generating parts such as LSIs are mounted. This MCM is a module designed to provide a predetermined function. This MCM is usually mounted on a large main substrate incorporated into an electronic device not shown in the drawing.

Since an MCM includes a large number of heat generating parts, a radiating body 1 is attached to MCM substrate B so that an upper surface of the MCM substrate B can be entirely covered with the radiating body 1. The radiating body 1 is integrally made of metal, the heat conductivity of which is high, for example, the radiating body 1 is integrally made of aluminum.

One surface of the radiating body 1 opposed to the upper surface of the substrate of MCM, which will be referred to as an inner surface hereinafter, is formed stepwise so that a predetermined clearance (gap) can be formed between the inner surface and electronic parts P on the substrate having various heights. This clearance is formed into a substantially uniform size all over the surface, or alternatively this clearance is formed into various sizes depending upon the positions on the inner surface.

In the clearance formed between the upper surface of each electronic part P and the inner surface of the radiating body 1, there is provided a flexible sheet S made of silicon rubber of a predetermined thickness, the heat conductivity of which is high, so that heat generated by each electronic part P can be effectively conducted to the inner surface of the radiating body 1. In this connection, it is possible to use a compound instead of the sheet, for example, it is possible to use a thermal grease (heat conducting grease) not shown in the drawing.

In order to maintain MCM substrate safely, the radiating body 1 is detachably fixed to MCM substrate B with a fastening body. In the examples shown in FIGS. 1 and 2, this fastening body is composed of four screws N (only two screws are shown in the drawings) which are set at four corners on the lower back side of MCM substrate B and screwed and fastened to the radiating body 1 while an MCM substrate is interposed between the four screws and the radiating body 1. In this connection, the number of the screws of the fastening body is not necessarily limited to four, but the number of the screws may be smaller or larger.

In the first embodiment, the arrangement of which is described above, heat generated by electronic parts P mounted on MCM substrate is effectively conducted to the radiating body 1 and emitted outside from the radiating body 1. In other words, it is possible to simultaneously and effectively cool the electronic parts P mounted on MCM substrate B.

When the above screws N are loosened and fastened, the radiating body 1 can be very simply attached to and detached from MCM substrate B. Accordingly, compared with a conventional radiating body (not shown in the drawings) which is made to adhere with adhesive, defective electronic parts on an MCM substrate can be very easily repaired or replaced even after the radiating body has been fastened. Therefore, this arrangement is very appropriate when it is put into practical use.

Even if the thermal expansion coefficient of electronic parts P to be cooled is different from that of the radiating body 1, the flexible sheet (heat conducting member) S arranged in the clearance functions as a cushion member. Due to the effect of this cushion member, no stress is generated, so that the electronic parts can not be damaged.

Figure 3:
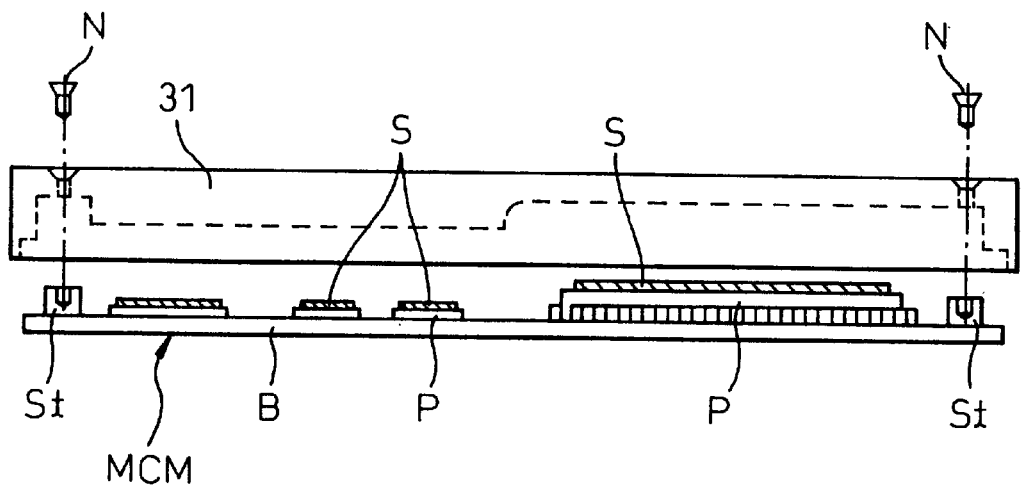
FIG. 3 is an exploded side view of the second embodiment.

In this connection, as shown in FIG. 3 in which the second embodiment is shown, it is possible to provide studs St having a female screw hole at four corners of MCM substrate, and screw N is screwed into each stud St arranged on MCM substrate B, so that the radiating body 31 can be fixed onto MCM substrate B by screws N.

Figure 4:
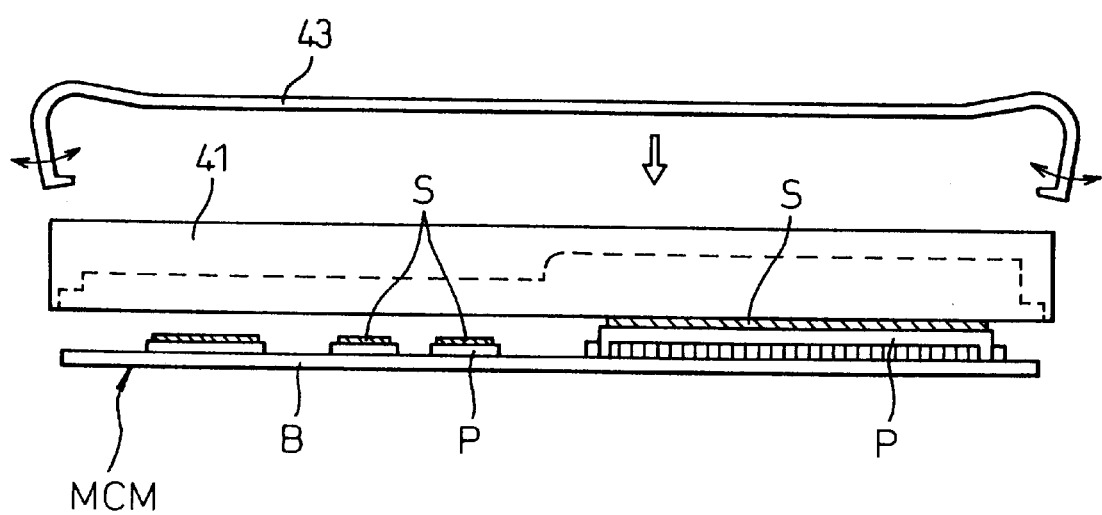
FIG. 4 is an exploded side view of the third embodiment.

As can be seen in FIG. 4, in which the third embodiment is shown, no screws are used, and it is possible to use an elastic frame 43, which is an example of the fastening body, having hooks on both sides capable of catching MCM substrate B so that the radiating body 41 can be detachably fixed to the MCM substrate in such a manner that the radiating body 41 is covered with the elastic frame 43. The elastic frame 43 is made of elastic material such as stainless steel.

Figure 5:
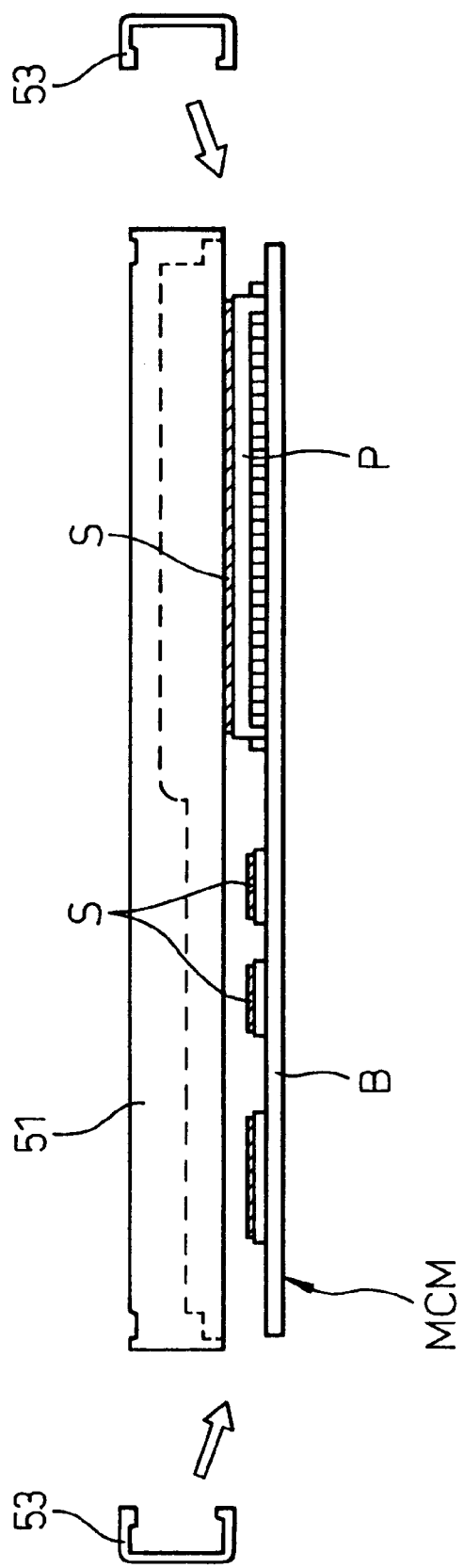
FIG. 5 is an exploded side view of the fourth embodiment.

As can be seen in FIG. 5, in which the fourth embodiment is shown, it is possible to use a plurality of C-shaped clips 53 to fix the radiating body 51 and MCM substrate B to each other at primary portions on the outer circumference of MCM substrate B. The clips 53 are made of elastic material such as stainless steel.

Figure 6:
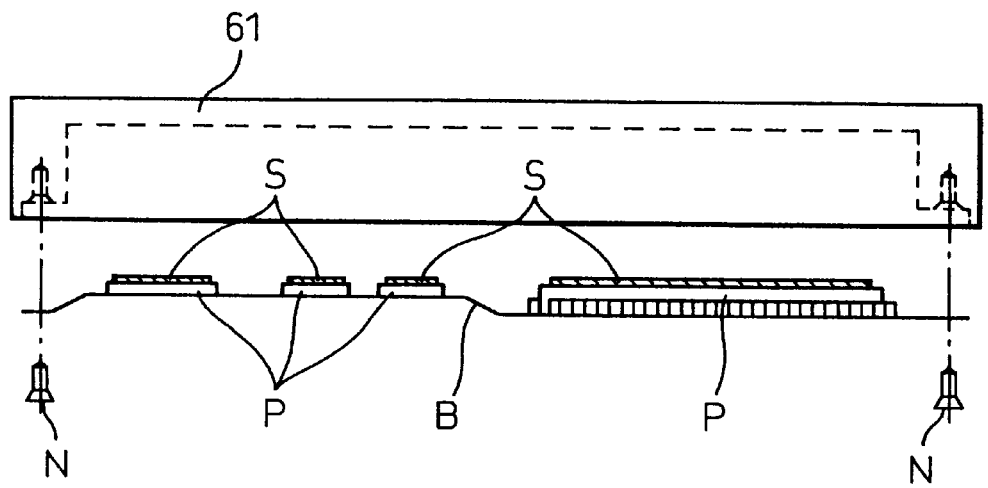
FIG. 6 is an exploded side view of the fifth embodiment.

As can be seen in FIG. 6, in which the fifth embodiment is shown, MCM substrate B is composed of a flexible substrate. In this case, the substrate B can be deformed into a desired profile when it is attached to the radiating body 61. Therefore, it is unnecessary to form the inner surface of the radiating body 61 into a steplike profile, that is, it is possible to form the inner surface of the radiating body 61 flat.

Figure 7:
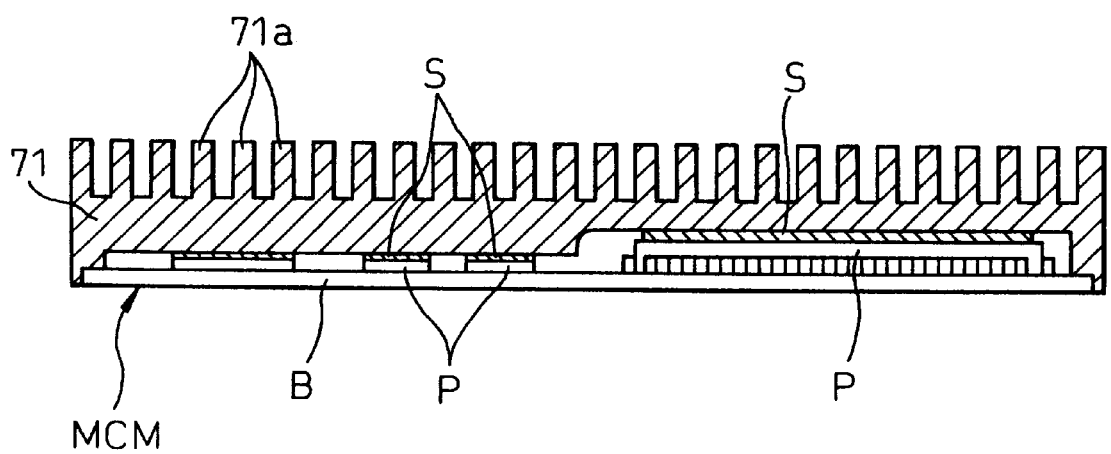
FIG. 7 is an exploded side view of the sixth embodiment.

As can be seen in FIG. 7, in which the sixth embodiment is shown, the radiating body 71 may be formed into a profile in which protrusions and recesses are provided in an upper portion of the radiating body 71, that is, a large number of fins 71a are formed in the upper portion of the radiating body 71 which is a heat sink. In this case, the radiating efficiency of the radiating body 71 can be greatly enhanced.

Figure 8:
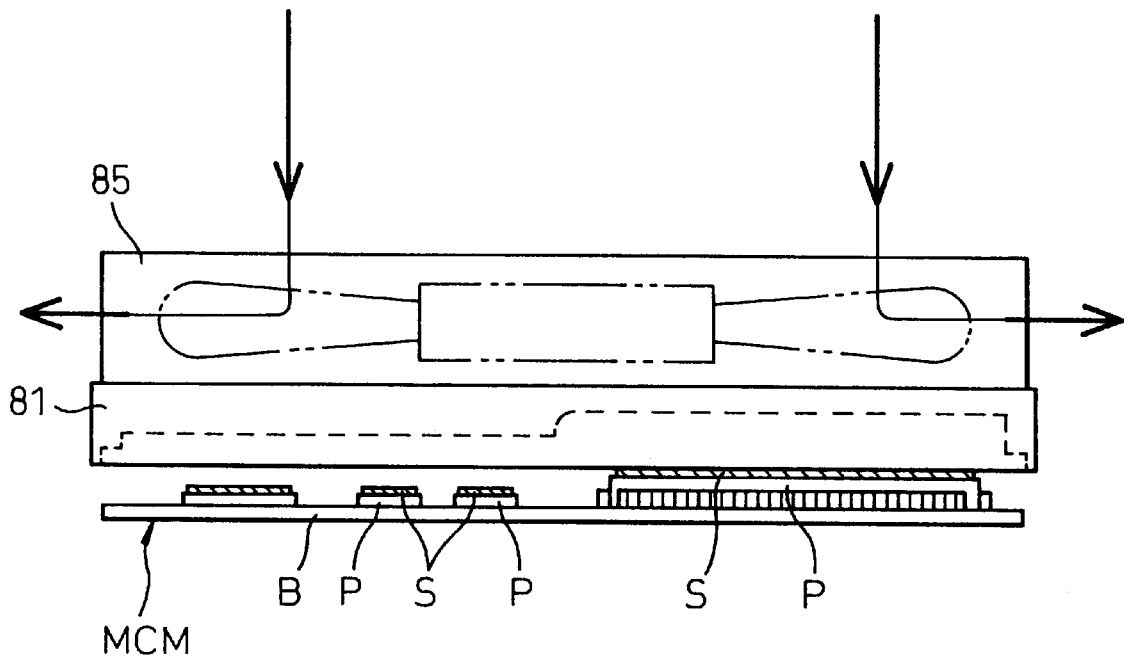
FIG. 8 is a cross-sectional side view of the seventh embodiment.

As can be seen in FIG. 8, in which the seventh embodiment is shown, it is possible to arrange a centrifugal fan 85 on an upper surface of the radiating body 81. In this case, the radiating efficiency of the radiating body 81 can be considerably enhanced.

In several embodiments explained below, there is provided an axial fan on an upper portion of the radiating body, and air is sent from the axial fan into the radiating body.

Figure 9:
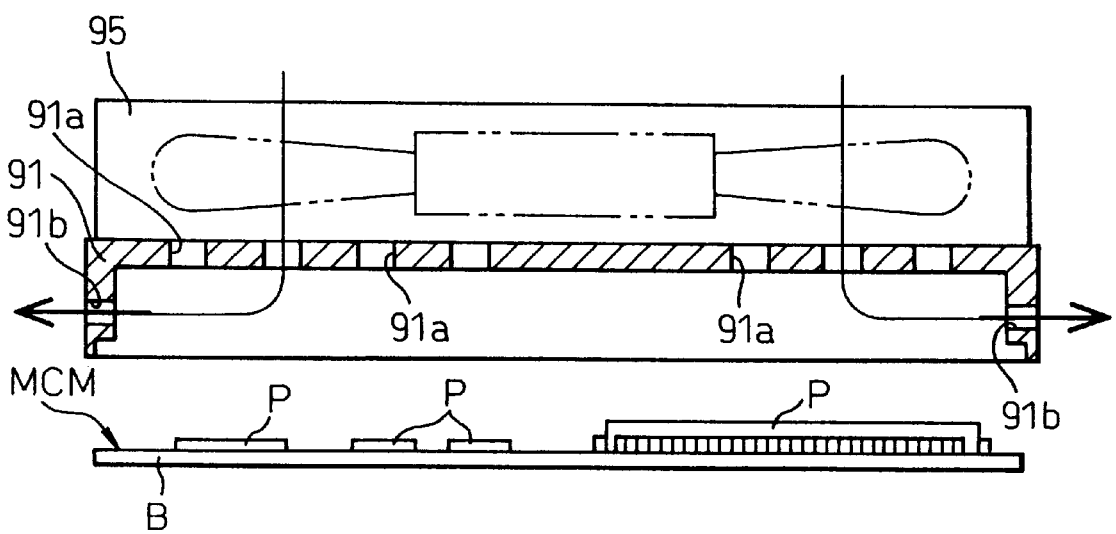
FIG. 9 is an exploded cross-sectional side view of the eighth embodiment.

As can be seen in FIG. 9, in which the eighth embodiment is shown, there are formed a plurality of through-holes (inlet ports 91a) in an upper portion of the radiating body 91 detachably fixed onto MCM substrate B in such a manner that the radiating body 91 covers MCM substrate B. The axial fan 95 is fixed onto the upper surface of the radiating body. On the four sides of the radiating body 91, a necessary number of through-holes (discharge ports 91b) are formed.

Due to the above arrangement, air sent from the axial fan 95 passes through the inlet ports 91a of the radiating body 91 and enters a space formed between the inner surface of the radiating body and the upper surface of MCM substrate. After that, air is discharged from the discharge port 91a of the radiating body 91. Since air effectively removes heat from the heat generating parts P on MCM substrate B at this time, it becomes possible to effectively suppress an increase in temperature of MCM substrate B. Since the air flow removes heat from MCM substrate B, it is preferable to adopt the above arrangement from the viewpoint of cooling the entire MCM substrate B.

It is preferable that the inlet ports 91a of the radiating body 91 are intensively arranged in a portion of the radiating body so that air which has entered the inner space of the radiating body 91 can be effectively blown out toward heat generating parts P.

Figure 10:
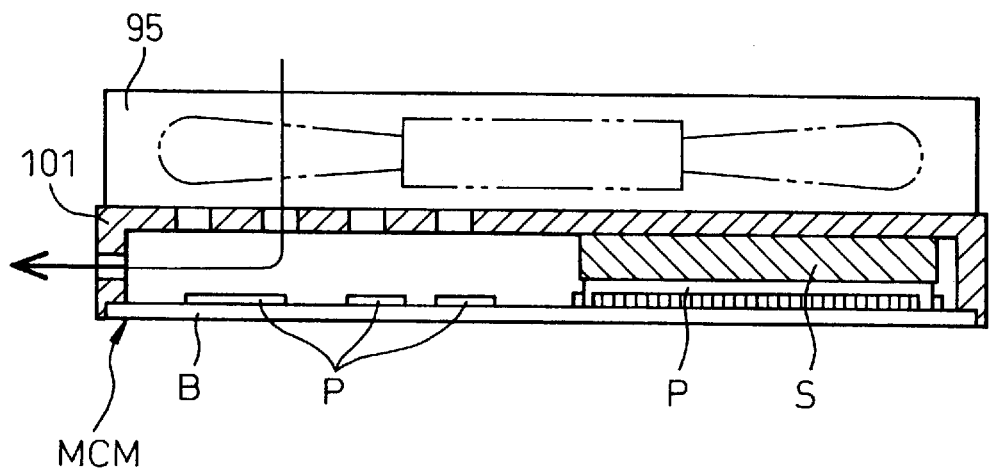
FIG. 10 is a cross-sectional side view of the ninth embodiment.

As can be seen in FIG. 10, in which the ninth embodiment is shown, as described in the first embodiment, a sheet S made of silicon rubber may be interposed in the clearance formed between the upper surface of a certain heat generating part P (on the right in the drawing) and the inner surface of the radiating body. In this case, the number of the discharge ports arranged on the side of the radiating body 101 may be reduced, so that a flow of air having a directivity can be formed.

Figure 11:
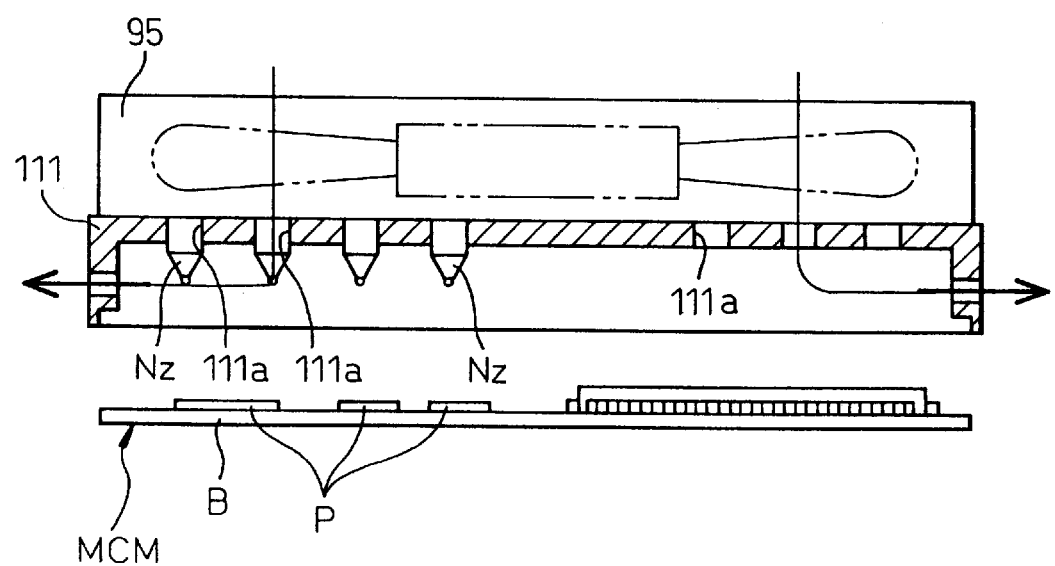
FIG. 11 is an exploded cross-sectional side view of the tenth embodiment.

As can be seen in FIG. 11 in which the tenth embodiment is shown, a nozzle Nz from which a flow of air is strongly jetted out to high heat generating parts P on MCM substrate B may be attached to at least one inlet port 111a of the radiating body, wherein four inlet ports are shown in the drawing.

As explained above, according to the present invention, the heat generating parts on an MCM substrate, which is formed into a module on which a plurality of heat generating electronic parts are mounted, can be effectively cooled. Therefore, it is possible to realize a cooling system in which the heat generating parts can be effectively cooled and the cooling system can be very simply attached to and detached from an MCM substrate.

It is to be understood that the invention is by no means limited to the specific embodiments illustrated and described herein, and that various modifications thereof may be made which come within the scope of the present invention as defined in the appended claims.

What is claimed is:

1. A cooling system cooling a multichip module having a substrate and a plurality of electronic parts including heat generating parts mounted to said substrate, comprising:

a radiating body having a top wall portion covering the upper portion of the plurality of electronic parts and a side peripheral wall portion extending from said top wall portion and contacting said substrate while an internal space is formed between the radiating body and the substrate. said radiating body having inlet ports formed through said top wall portion and discharge ports formed through said side peripheral wall portion;

a fastening body detachably connecting the radiating body with the substrate of the multichip module; and an axial fan attached to said top wall portion of the radiating body, so that air flows from the axial fan into the internal space through said inlet ports and from the internal space to the outside of the radiating body through said discharge ports.

2. The cooling system cooling a multichip module according to claim 1, wherein the inlet ports of the radiating body are intensively arranged in a portion of the radiating body corresponding to a region on the substrate in which a large quantity of heat is generated.

3. The cooling system cooling a multichip module according to claim 1, wherein a nozzle from which air is strongly blown out to a region on the substrate in which a large quantity of heat is generated is attached to at least one inlet port of the radiating body.

* * * * *